(12) United States Patent
Cheng et al.

(10) Patent No.: US 9,614,087 B1
(45) Date of Patent: Apr. 4, 2017

(54) STRAINED VERTICAL FIELD-EFFECT TRANSISTOR (FET) AND METHOD OF FORMING THE SAME

(71) Applicant: International Business Machines Corporation, Armonk, NY (US)

(72) Inventors: Kangguo Cheng, Schenectady, NY (US); Juntao Li, Cohoes, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/156,923

(22) Filed: May 17, 2016

(51) Int. Cl.
| | | |
|---|---|---|
| H01L 21/70 | (2006.01) |
| H01L 29/78 | (2006.01) |
| H01L 29/66 | (2006.01) |
| H01L 29/786 | (2006.01) |
| H01L 29/423 | (2006.01) |
| H01L 21/02 | (2006.01) |
| H01L 29/06 | (2006.01) |

(52) U.S. Cl.
CPC .... *H01L 29/7849* (2013.01); *H01L 21/02236* (2013.01); *H01L 29/0649* (2013.01); *H01L 29/42392* (2013.01); *H01L 29/66666* (2013.01); *H01L 29/66742* (2013.01); *H01L 29/78642* (2013.01); *H01L 29/78684* (2013.01)

(58) Field of Classification Search
None
See application file for complete search history.

(56) References Cited

U.S. PATENT DOCUMENTS

| 7,368,358 B2 | 5/2008 | Ouyang et al. |
| 7,608,496 B2 | 10/2009 | Chu |
| 8,637,849 B2 | 1/2014 | Deligianni et al. |
| 8,648,388 B2 | 2/2014 | Khakifirooz et al. |

(Continued)

FOREIGN PATENT DOCUMENTS

| CN | 103187297 A | 7/2013 |
| TW | 1456754 B | 10/2014 |

OTHER PUBLICATIONS

X. Chen et al., "Hole and Electron Mobility Enhancement in Strained SiGe Vertical MOSFETs," IEEE Transactions on Electron Devices, Sep. 2001, pp. 1975-1980, vol. 48, No. 9.

(Continued)

*Primary Examiner* — Michael Lebentritt
(74) *Attorney, Agent, or Firm* — Vazken Alexanian; Ryan, Mason & Lewis, LLP

(57) ABSTRACT

A method for manufacturing a semiconductor device includes forming a first semiconductor layer on a substrate, forming a bottom source/drain region on the first semiconductor layer, forming a second semiconductor layer on the bottom source/drain region, patterning the second semiconductor layer into a plurality of fins extending from the bottom source/drain region vertically with respect to the substrate, forming a gate structure around the plurality of fins, forming a top source/drain region on each of the plurality of fins, oxidizing the first semiconductor layer to form an oxide layer in place of the first semiconductor layer, wherein a volume of the oxide layer is larger than a volume of the first semiconductor layer prior to the oxidation, and producing a strain in each of the plurality of fins due to the larger volume of the oxide layer.

20 Claims, 12 Drawing Sheets

(56) References Cited

U.S. PATENT DOCUMENTS

| | | | |
|---|---|---|---|
| 9,418,897 B1* | 8/2016 | Ching | H01L 29/66795 |
| 9,431,521 B1* | 8/2016 | Cheng | H01L 29/66795 |
| 9,449,975 B1* | 9/2016 | Ching | H01L 27/0922 |
| 9,490,348 B2* | 11/2016 | Ching | H01L 29/7856 |
| 2007/0228433 A1* | 10/2007 | Forbes | B82Y 10/00 |
| | | | 257/296 |
| 2013/0015525 A1* | 1/2013 | Cheng | H01L 21/0217 |
| | | | 257/351 |
| 2014/0008736 A1 | 1/2014 | Li et al. | |
| 2015/0270349 A1 | 9/2015 | Cheng et al. | |
| 2015/0357411 A1 | 12/2015 | Cheng et al. | |
| 2016/0079124 A1* | 3/2016 | Yin | H01L 21/82343 |
| | | | 438/283 |
| 2016/0240616 A1* | 8/2016 | Cea | H01L 29/66431 |

OTHER PUBLICATIONS

T.V. Dinh et al., "Investigation of the Performance of Strained-SiGe Vertical IMOS-Transistors," Proceedings of the European Solid State Device Research Conference, Sep. 14-18, 2009, pp. 165-168, Athens, Greece.

English translation for Taiwan Application No. TW1456754B.

English translation for China Application No. CN103187297A.

M. Tanaka et al., "Abnormal Oxidation Characteristics of SiGe/Si-on-Insulator Structures Depending on Piled-Up Ge Fraction at SiO2/SiGe Interface," Journal of Applied Physics, Feb. 2008, 6 pages, vol. 103, No. 5.

\* cited by examiner

US 9,614,087 B1

STRAINED VERTICAL FIELD-EFFECT TRANSISTOR (FET) AND METHOD OF FORMING THE SAME

TECHNICAL FIELD

The field generally relates to semiconductor devices and methods of manufacturing same and, in particular, to using an oxidation process to produce strain in dielectric isolated fins of a vertical fin field-effect transistor (FinFET).

BACKGROUND

Fin field-effect transistor (FinFET) devices include a transistor architecture that uses raised source-to-drain channel regions, referred to as fins. A FinFET device can be built on a semiconductor substrate, where a semiconductor material, such as silicon, is patterned into fin-like shapes and functions as the channels of the transistors.

Known FinFET devices include fins with source/drain regions on lateral sides of the fins, so that current flows in a horizontal direction (e.g., parallel to a substrate) between source/drain regions at opposite ends of the fins in the horizontal direction. The known structures have their architectures limited by scaling plateaus. For example, known horizontal devices can have contacted poly pitch (CPP) plateaus between 30 nm and 50 nm, and are driven by such competing considerations as electrostatics, contact resistance ($R_{contact}$), and maximum voltage ($V_{max}$).

Vertical transport architecture FET devices include source/drain regions at ends of the fins on top and bottom sides of the fins so that current runs through the fins in a vertical direction (e.g., perpendicular to a substrate) from a bottom source/drain region to a top source/drain region. Vertical transport architecture devices are designed to extend the product value proposition beyond conventional plateaus and address the limitations of horizontal device architectures by, for example, decoupling of gate length from the contact gate pitch, providing a FinFET-equivalent density at a larger CPP. Therefore, vertical transistors have been explored as a viable device option for continued complementary metal-oxide semiconductor (CMOS) scaling beyond 7 nm node.

SUMMARY

According to an exemplary embodiment of the present invention, a method for manufacturing a semiconductor device includes forming a first semiconductor layer on a substrate, forming a bottom source/drain region on the first semiconductor layer, forming a second semiconductor layer on the bottom source/drain region, patterning the second semiconductor layer into a plurality of fins extending from the bottom source/drain region vertically with respect to the substrate, forming a gate structure around the plurality of fins, forming a top source/drain region on each of the plurality of fins, oxidizing the first semiconductor layer to form an oxide layer in place of the first semiconductor layer, wherein a volume of the oxide layer is larger than a volume of the first semiconductor layer prior to the oxidation, and producing a strain in each of the plurality of fins due to the larger volume of the oxide layer.

According to an exemplary embodiment of the present invention, a semiconductor device includes a substrate, an oxide layer on the substrate, a bottom source/drain region on the oxide layer, a plurality of fins extending from the bottom source/drain region vertically with respect to the substrate, a gate structure around the plurality of fins, and a top source/drain region on each of the plurality of fins, wherein each of the plurality of fins is strained in vertical direction with respect to the substrate.

According to an exemplary embodiment of the present invention, a method for manufacturing a semiconductor device includes epitaxially growing a first semiconductor layer comprising silicon germanium on a substrate, epitaxially growing a bottom source/drain region on the first semiconductor layer, epitaxially growing a second semiconductor layer on the bottom source/drain region, patterning the second semiconductor layer into a plurality of fins extending from the bottom source/drain region vertically with respect to the substrate, forming a gate structure around the plurality of fins, forming a top source/drain region on each of the plurality of fins, oxidizing the first semiconductor layer to form an oxide layer in place of the first semiconductor layer, wherein a volume of the oxide layer is larger than a volume of the first semiconductor layer prior to the oxidation, and producing a strain in each of the plurality of fins due to the larger volume of the oxide layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
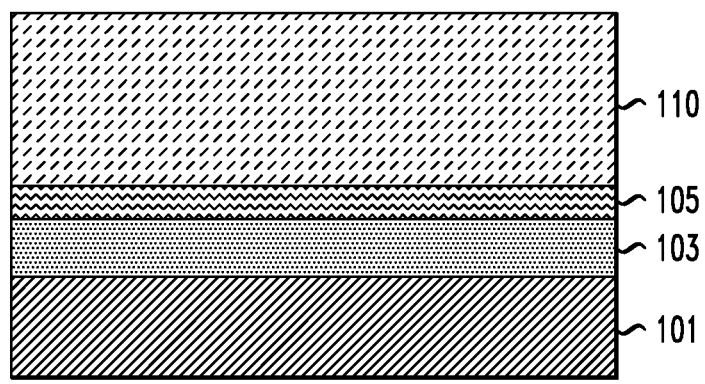
FIG. 1 is a cross-sectional view illustrating formation of doped and undoped semiconductor layers on a substrate in a method for manufacturing a semiconductor device, according to an exemplary embodiment of the present invention.

Exemplary embodiments of the invention will now be discussed in further detail with regard to semiconductor devices and methods of manufacturing same and, in particular, to producing and preserving strain in fins of a vertical fin field-effect transistor (FinFET).

Embodiments of the present invention relate to strain engineering for enhancing the drive current of vertical transistors. Relative to conventional horizontal transistors, it is difficult to maintain vertical strain in fin pillars because vertical strain in vertical semiconductor pillars becomes relaxed when using conventional processing regardless of an initial strain status. In accordance with an embodiment of the present invention, vertical strain is maintained in the resulting device.

Embodiments of the present invention provide a method for forming strained vertical FETs. Strain in the vertical direction is introduced to the channels by a volume expansion of an oxide formed as a result of an oxidation process. The strain is preserved by the previously formed layers around the fin pillars, such as, for example, previously formed gate and source/drain regions.

According to an embodiment of the present invention, strained vertical FinFETs are manufactured by forming dielectric isolated fins on a bulk substrate by converting SiGe under the fins into a silicon oxide (e.g., silicon dioxide ($SiO_2$)) by an oxidation process. The oxide volume expansion introduces vertical stress into the vertical channels to cause the vertical strain.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional and three-dimensional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a substrate in the cross-sectional views, and "horizontal" refers to a direction parallel to a substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

FIG. 1 is a cross-sectional view illustrating formation of doped and undoped semiconductor layers on a substrate in a method for manufacturing a semiconductor device, according to an exemplary embodiment of the present invention.

A fin of a FinFET can include, for example, silicon, and is a conducting channel that protrudes vertically from a substrate and conducts in a direction from a source to a drain. As can be understood by one of ordinary skill in the art, a plurality of fins can be formed on the substrate 101 and spaced apart from each other at regular intervals. A plurality of gates can intersect the fins.

Referring to FIG. 1, a semiconductor substrate 101 can be, for example, a bulk substrate including semiconductor material including, but not limited to, silicon (Si), silicon germanium (SiGe), strain-relaxed buffer (SRB) SiGe, silicon carbide (SiC), silicon-germanium-carbon (SiGeC) or other like semiconductor. Although silicon is an often used semiconductor material in wafer fabrication, alternative semiconductor materials can be employed, such as, but not limited to, germanium, gallium arsenide, gallium nitride, silicon germanium, cadmium telluride and zinc selenide. In addition, multiple layers of the semiconductor materials can be used as the semiconductor material of the substrate.

In accordance with an embodiment of the present invention, the substrate 101 is a bulk silicon substrate, and a semiconductor layer 103 including, but not necessarily limited to, SiGe, is epitaxially grown on the substrate 101. An n+ or p+ doped semiconductor layer 105 and an undoped semiconductor layer 110 are epitaxially grown on the semiconductor layer 103. The doped semiconductor layer 105 can include, but is not necessarily limited to, Si, SiGe or SiC. The undoped semiconductor layer 110, also referred to herein as a channel layer, can include, but is not necessarily limited to, Si, SiGe or III-V materials. In accordance with an embodiment, the layers 105 and 110 each comprise silicon, and may be referred to herein as silicon layers.

Doping of the semiconductor layer 105 can be performed using, for example, ion implantation, or annealing if not using an epitaxial process. In a non-limiting illustrative example, the doping of the layer 105 uses, for example, arsenic (As) or phosphorous (P) for n-type device (e.g., nFET), and boron (B) for a p-type device (e.g., pFET), at concentrations in the general range of $e20/cm^3$. The doped semiconductor layer 105 functions as a bottom source/drain region of a resulting vertical FET.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

Figure 2:
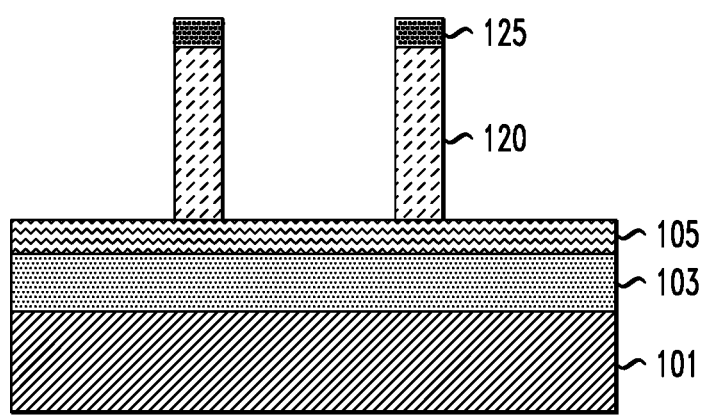
FIG. 2 is a cross-sectional view illustrating fin formation in a method for manufacturing a semiconductor device, according to an exemplary embodiment of the present invention.

FIG. 2 is a cross-sectional view illustrating fin formation in a method for manufacturing a semiconductor device, according to an exemplary embodiment of the present invention. Fins, such as a fin 120, can be formed by patterning the semiconductor layer 110 into the fins 120. A hardmask 125 including, for example, a dielectric material, such as silicon nitride (SiN) is formed on portions that are to be formed into the fins 120. The fin patterning can be done by a spacer image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography defined mandrel to spacers, where the pattern density is doubled. The spacer pattern can be used as the hardmask 125 to form the fins 120 by RIE processes. According to an embodiment, the fins can be patterned to a height of about 20 nm to about 50 nm.

Figure 3:
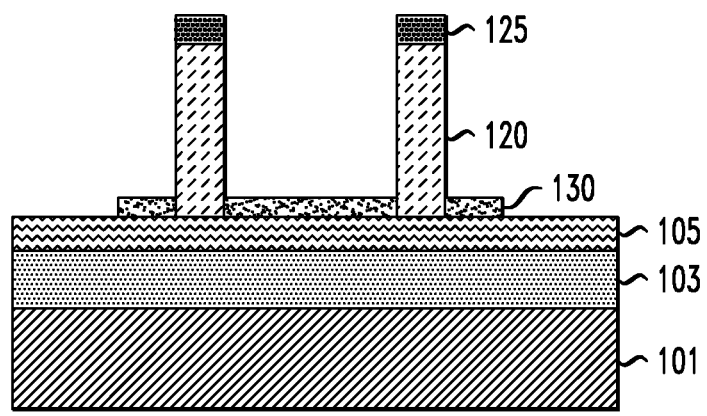
FIG. 3 is a cross-sectional view illustrating formation of a bottom spacer dielectric layer in a method for manufacturing a semiconductor device, according to an exemplary embodiment of the present invention.

FIG. 3 is a cross-sectional view illustrating formation of a bottom spacer dielectric layer in a method for manufacturing a semiconductor device, according to an exemplary embodiment of the present invention. According to an embodiment of the present invention, spacer dielectric layers, such as, for example a plasma enhanced chemical vapor deposition (PECVD)-type, high aspect ratio process (HARP)-type or high density plasma (HDP)-type low-K dielectric layers, including, but not limited to, siliconborocarbonitride (SiBCN), silicon oxycarbonitride (SiOCN), SiN or $SiO_2$, are deposited using, for example, PECVD, HARP or HDP techniques, on the layer 105 and on the stacked structures including the fins 120 and the hardmasks 125. Portions of the deposited spacer dielectric layers are removed by, for example, an etchback process, to result in bottom spacer layers 130 that correspond to lower portions of the fins 120.

In an alternative process for forming spacer layers, the spacer dielectric layers, such as, for example a PECVD-type, HARP-type or HDP-type low-K dielectric layers are deposited to be thicker on horizontal portions (e.g., on layer 105, and on the top surfaces of the hardmasks 125) than on the vertical side portions of the stacked structures including the fins 120 and the hardmasks 125. Then, an anisotropic etching process, such as RIE, ion beam etching, plasma etching or laser ablation is performed to completely remove the dielectric layers from the vertical side portions of the stacked structures including the fins 120 and the hardmasks 125, while leaving part or all of the dielectric layers on the horizontal portions.

Figure 4:
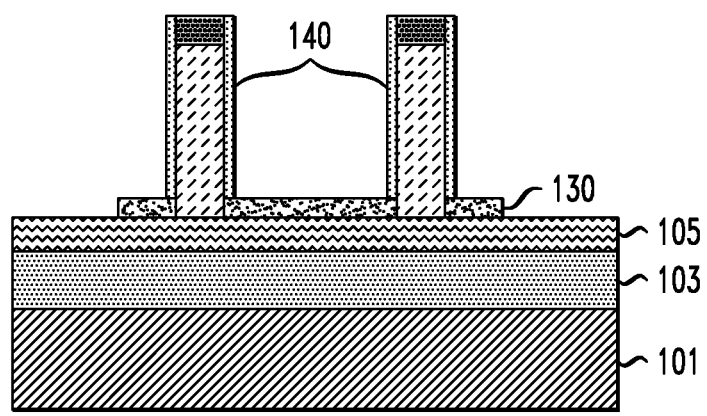
FIG. 4 is a cross-sectional view illustrating formation of gate dielectric layers in a method for manufacturing a semiconductor device, according to an exemplary embodiment of the present invention.

FIG. 4 is a cross-sectional view illustrating formation of gate dielectric layers in a method for manufacturing a semiconductor device, according to an exemplary embodiment of the present invention. High-K dielectric layers 140 including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) are deposited on the spacer layers 130 and on and around the stacked structures including the fins 120 and hardmasks 125. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as, for example, lanthanum and aluminum. A work-function metal (WFM) layer (not shown), including but not limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, can be deposited on the high-K dielectric layer 140.

Figure 5:
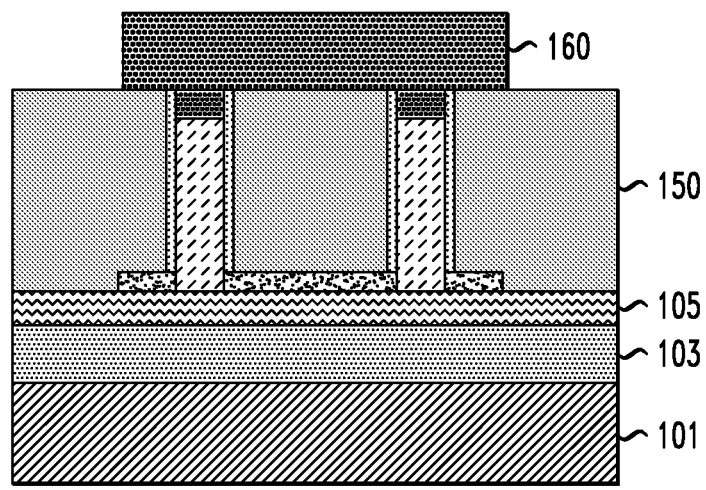
FIG. 5 is a cross-sectional view illustrating formation of a gate layer in a method for manufacturing a semiconductor device, according to an exemplary embodiment of the present invention.

Referring to FIG. 5, which is a cross-sectional view illustrating formation of a gate layer in a method for manufacturing a semiconductor device, according to an exemplary embodiment of the present invention, a gate layer 150 including, but not necessarily limited to, amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof is deposited on gate dielectric layers 140 (or on the gate dielectric layer 140 and the WFM layer), on the spacer layers 130 and on layer 105. The gate structure including the dielectric layers 140, the WFM layer and gate layer 150 may be formed using, for example, deposition techniques including, but not limited to, CVD, PECVD, radio-frequency CVD (RFCVD), physical vapor deposition (PVD), atomic layer deposition (ALD), molecular layer deposition (MLD), molecular beam deposition (MBD), pulsed laser deposition (PLD), and/or liquid source misted chemical deposition (LSMCD), sputtering, and/or plating, followed by a planarization process, such as, chemical mechanical planarization (CMP) to remove excess upper portions of the dielectric layers 140, WFM layer and gate layer 150. Planarization can be performed down to the hardmasks 125.

Figure 6:
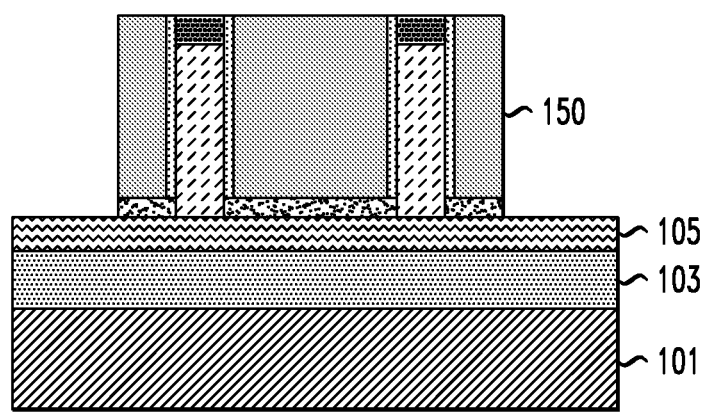
FIG. 6 is a cross-sectional view illustrating patterning of a gate layer and removal of a mask in a method for manufacturing a semiconductor device, according to an exemplary embodiment of the present invention.

FIG. 5 further illustrates a mask 160 for gate structure patterning, which is deposited on the planarized gate structure to cover portions of the gate structure that will remain after a removal process. The removal process can include, but is not limited to, a lithography process (e.g., optical or extreme ultraviolet (EUV) direct patterning or a spacer imaging transfer process). Using optical lithography as an example, an organic planarization layer (OPL), silicon-containing antireflection coating (SiARC) and photoresist are formed on the planarized gate structure, then after exposure and development, the photoresist will be formed into patterns. Then, the photoresist will be used as mask when etching the SiARC. After that, the patterned SiARC becomes a hard mask to pattern the OPL. Finally the patterned OPL is used as mask 160 when etching down the gate material. As a result, the lithography pattern is transferred to form the gate material. As shown in FIG. 6, the etching process, including but not limited to, fluorinated gases, such as carbon tetrafluoride ($CF_4$), sulfur hexafluoride ($SF_6$) or fluoroform ($CHF_3$), is then performed to remove those portions of the gate layer left exposed by the mask 160 where gates are not required, and the mask 160 is removed.

Figure 7:
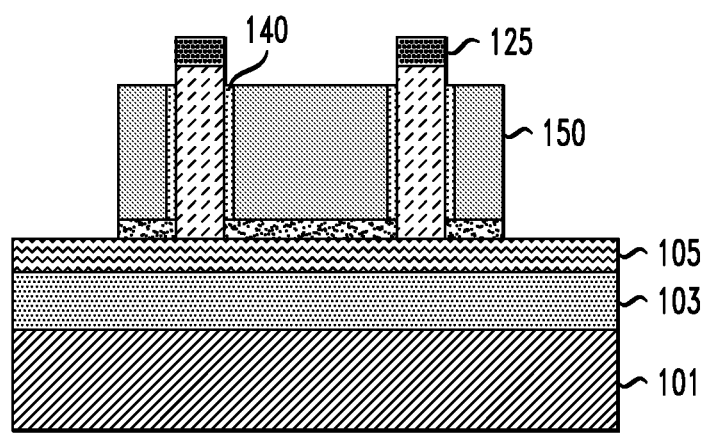
FIG. 7 is a cross-sectional view illustrating recessing of a gate structure including a gate and gate dielectric layers in a method for manufacturing a semiconductor device, according to an exemplary embodiment of the present invention.

FIG. 7 is a cross-sectional view illustrating recessing of a gate structure including a gate and gate dielectric layers in a method for manufacturing a semiconductor device, according to an exemplary embodiment of the present invention. As shown in FIG. 7, portions of the gate structure, including the dielectric layers 140 and gate layers 150, are removed using, for example, an anisotropic etch process, such as RIE, ion beam etching, plasma etching or laser ablation. As can be seen, the layers 140 and 150 are recessed to lower heights above the substrate 101.

Figure 8:
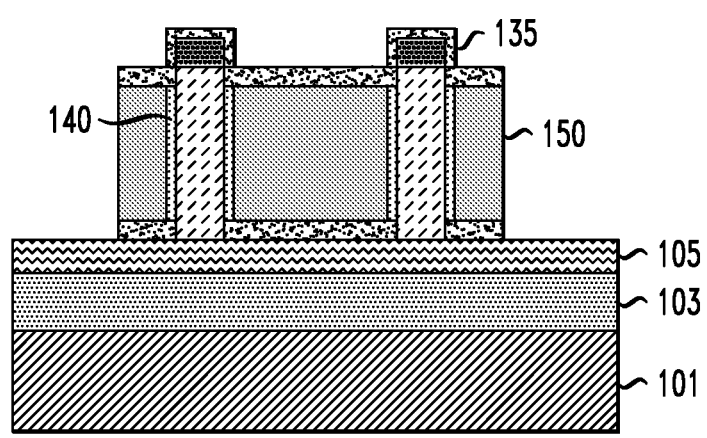
FIG. 8 is a cross-sectional view illustrating formation of dielectric spacer layers in a method for manufacturing a semiconductor device, according to an exemplary embodiment of the present invention.

FIG. 8 is a cross-sectional view illustrating formation of dielectric spacer layers in a method for manufacturing a semiconductor device, according to an exemplary embodiment of the present invention. As shown in FIG. 8, spacer dielectric layers 135, such as, for example a PECVD-type, HARP-type or HDP-type low-K dielectric layers, including, but not limited to, SiBCN, SiN or $SiO_2$ are deposited using, for example, PECVD, HARP or HDP techniques, on the recessed gate structures, and on the stacked structures including the fins 120 and hardmasks 125. An anisotropic etching process, such as ME, ion beam etching, plasma etching or laser ablation can be performed to remove the dielectric layers 135 from the vertical side portions of the stacked structures, while leaving part or all of the dielectric layers 135 on the horizontal portions.

Figure 9:
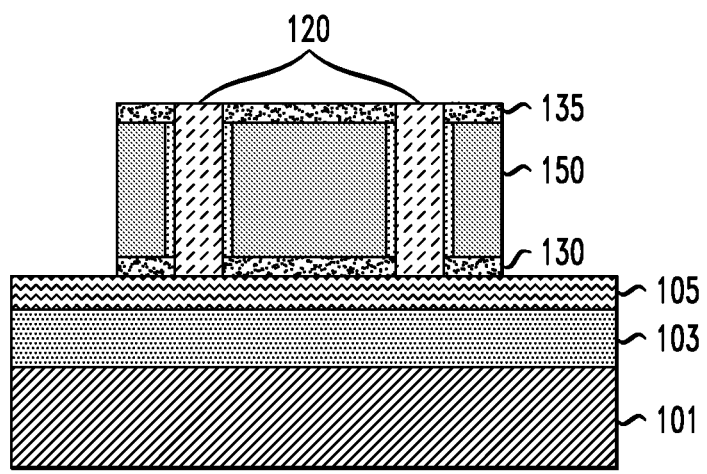
FIG. 9 is a cross-sectional view illustrating selective removal of the hardmasks and portions of dielectric spacer layers in a method for manufacturing a semiconductor device, according to an exemplary embodiment of the present invention.

FIG. 9 is a cross-sectional view illustrating selective removal of the hardmasks 125 and portions of the dielectric layers 135 in a method for manufacturing a semiconductor device, according to an exemplary embodiment of the present invention. As shown in FIG. 9, the hardmasks 125 and portions of the dielectric layers 135 are selectively removed, using for example, a selective etch process. The selective etch process can include, for example, fluorinated gas (such as $SF_6$, $CH_4$, or $CHF_3$) based dry etching or hot phosphoric acid ($H_3PO_4$) etching. As can be seen, the layers 125, 135 are etched until the hardmasks 125 are removed so that the remaining portions of the dielectric layers 135 each have a top surface that is level or substantially with a top surface of the fins 120. Prior to selective removal of the hardmasks 125 and portions of the dielectric layers 135, the portions of the dielectric layers 135 that are to remain to form the top spacer layer 135 on the gate structure are protected by a dielectric material, including, but not limited to $SiO_2$, low-temperature oxide (LTO), high-temperature oxide (HTO), flowable oxide (FOX) or some other dielectric, which is later removed using, for example, another selective etching process, such as a selective oxide etch using, for example, $F/NH_3$ based dry etching.

Figure 10:
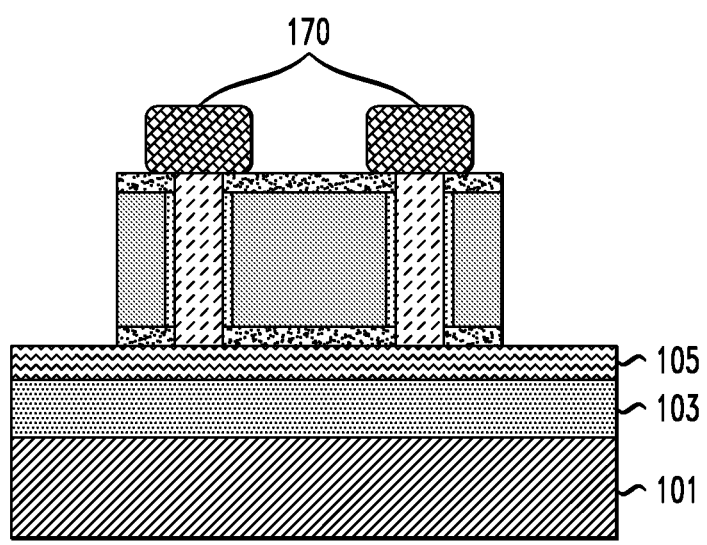
FIG. 10 is a cross-sectional view illustrating epitaxial growth of top source/drain regions in a method for manufacturing a semiconductor device, according to an exemplary embodiment of the present invention.

FIG. 10 is a cross-sectional view illustrating epitaxial growth of top source/drain regions in a method for manufacturing a semiconductor device, according to an exemplary embodiment of the present invention. As shown in FIG. 10, top source/drain regions 170 are epitaxially grown on the fins 120. Application of the sources for nFET and pFET epitaxial growth can be done by using block level patterning. For an nFET, As or P doped Si or SiC source/drain regions 170 are epitaxially grown. For a pFET, B doped SiGe or Si source/drain regions 170 are epitaxially grown. Doping can be at concentrations in the general range of $e20/cm^3$. As can be seen in FIG. 10, epitaxial growth is stopped prior to merging so that the epitaxial regions 170 are not merged with each other. Alternatively, the epitaxial growth is not stopped prior to merging so that the epitaxial regions 170 are merged with each other. While the shape of the epitaxial source/drain regions 170 is illustrated as a quadrilateral, the embodiments of the present invention are not necessarily limited thereto, and other epitaxial shapes, including, but not necessarily limited to, pentagonal, may be formed depending on orientations and materials used.

Figure 11:
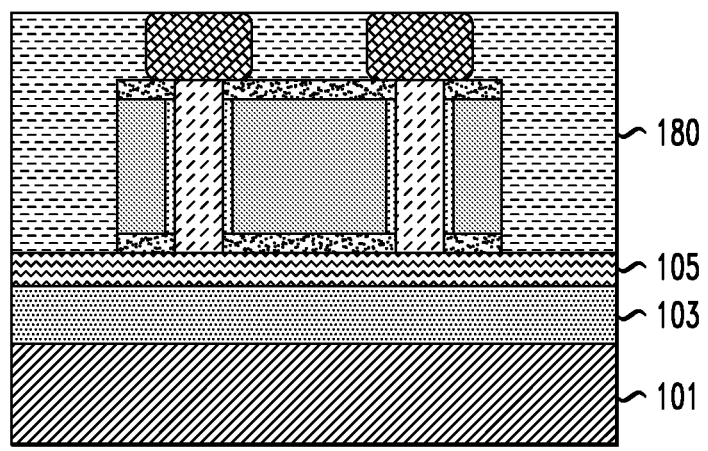
FIG. 11 is a cross-sectional view illustrating formation of an interlayer dielectric layer in a method for manufacturing a semiconductor device, according to an exemplary embodiment of the present invention.

FIG. 11 is a cross-sectional view illustrating formation of an interlayer dielectric layer in a method for manufacturing a semiconductor device, according to an exemplary embodiment of the present invention. As shown in FIG. 11, a dielectric material, including, but not limited to $SiO_2$, LTO, HTO, FOX or some other dielectric, is deposited on the structure from FIG. 10 on and around the top source/drain regions 170 to form interlayer dielectric layer 180. The interlayer dielectric layer 180 can be deposited using deposition techniques including, but not limited to, CVD, PECVD, RFCVD, PVD, ALD, MLD, MBD, PLD, and/or LSMCD, sputtering, and/or plating. Planarization, for example, CMP can be performed to remove excess material from layer 180 and planarize the resulting structure.

Figure 12:
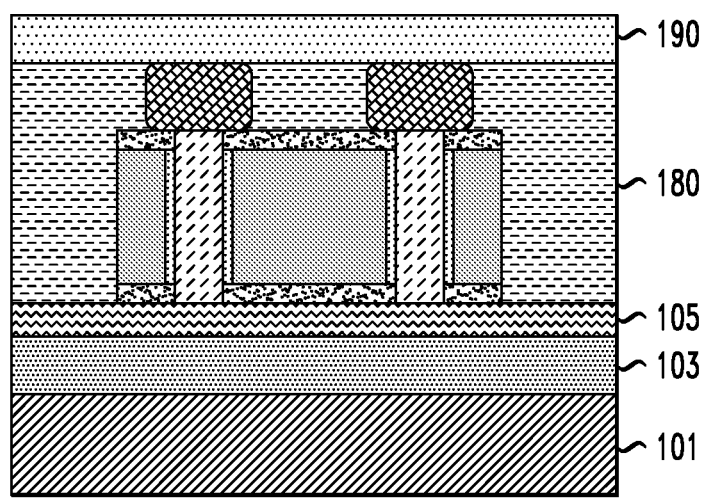
FIG. 12 is a cross-sectional view illustrating formation of an upper dielectric layer on the interlayer dielectric layer in a method for manufacturing a semiconductor device, according to an exemplary embodiment of the present invention.

FIG. 12 is a cross-sectional view illustrating formation of an upper dielectric layer on the interlayer dielectric layer in a method for manufacturing a semiconductor device, according to an exemplary embodiment of the present invention. As shown in FIG. 12, an upper dielectric layer 190 is deposited on the interlayer dielectric layer 180 to protect transistors from a top side during a subsequent oxidation process described in connection with FIGS. 15A and 15B below. The upper dielectric layer 190 can be deposited using deposition techniques including, but not limited to, CVD, PECVD, RFCVD, PVD, ALD, MLD, MBD, PLD, and/or LSMCD, sputtering, and/or plating, and can include, but is not necessarily limited to a nitride, such as, for example, SiN or other dielectric materials having a high Young's modulus. Planarization, for example, CMP can be performed to remove excess material from layer 190 and planarize the resulting structure.

Figure 13:
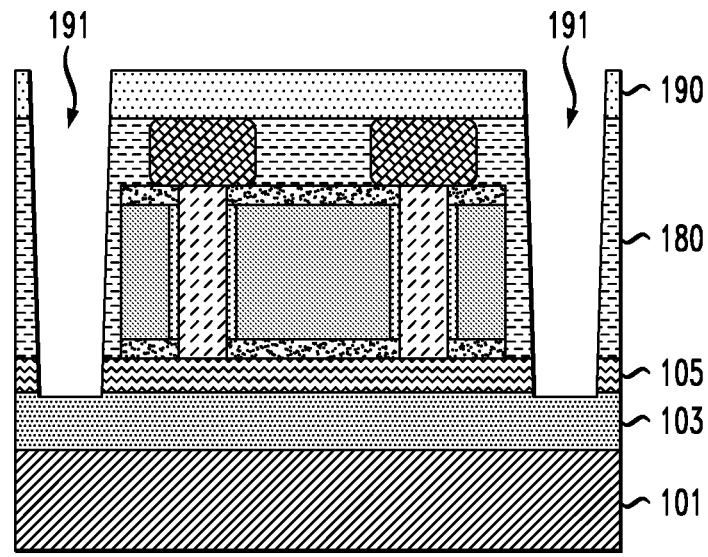
FIG. 13 is a cross-sectional view illustrating formation of trenches in a method for manufacturing a semiconductor device, according to an exemplary embodiment of the present invention.

FIG. 13 is a cross-sectional view illustrating formation of trenches in a method for manufacturing a semiconductor device, according to an exemplary embodiment of the present invention. As shown in FIG. 13, trenches 191 are formed through the upper dielectric layer 190, interlayer dielectric layer 180, and bottom source/drain region 105, and penetrating into layer 103 (e.g., SiGe layer). The trenches can be formed using an anisotropic etching process, such as, for example, RIE, ion beam etching, plasma etching or laser ablation. For example, anisotropic RIE processes can be performed using an etchant including, but not necessarily limited to $CF_4$ or $CHF_3$ with inert gas mixtures. Although two trenches 191 are illustrated, the number of trenches is not necessarily limited thereto, and there may be more or less trenches.

Figure 14:
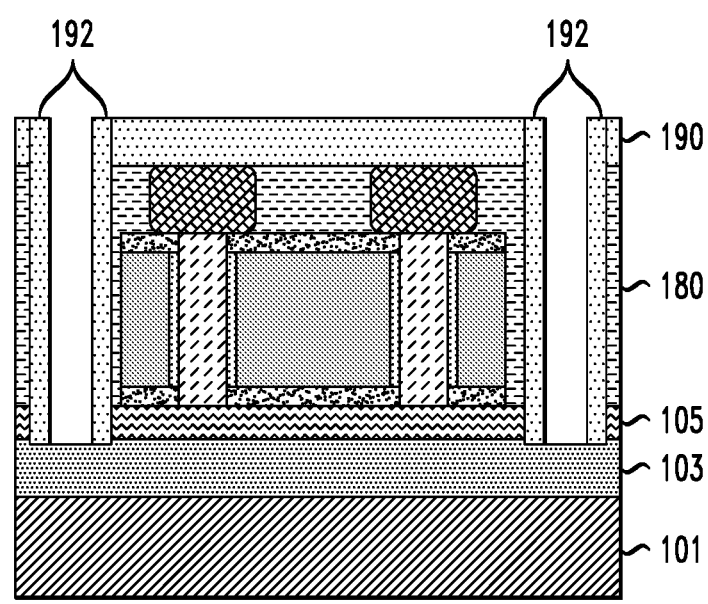
FIG. 14 is a cross-sectional view illustrating formation of trench sidewall spacers in a method for manufacturing a semiconductor device, according to an exemplary embodiment of the present invention.

FIG. 14 is a cross-sectional view illustrating formation of trench sidewall spacers in a method for manufacturing a semiconductor device, according to an exemplary embodiment of the present invention. As shown in FIG. 14, trench sidewall spacers 192 are deposited on the sidewalls of the trenches 191 to protect transistors from lateral sides during the subsequent oxidation process described in connection with FIGS. 15A and 15B below. The trench sidewall spacers 192 can be deposited using deposition techniques including, but not limited to, CVD, PECVD, RFCVD, PVD, ALD, MLD, MBD, PLD, and/or LSMCD, sputtering, and/or plating, and can include, but are not necessarily limited to a nitride, such as, for example, SiN or other suitable materials that can be used as oxygen diffusion barrier. After deposition, the spacer material can be removed from a bottom of each trench 191 (i.e., from the surface of the layer 103) by, for example, an anisotropic etching process, such as, RIE, ion beam etching, plasma etching or laser ablation, using an etchant including, but not necessarily limited to $CF_4$, $CHF_3$, or $CH_2F_2$ chemistries. A width of the trench sidewall spacers 192 in a horizontal direction can be in the range of, for example, about 2 nm to about 25 nm.

Figure 15B:
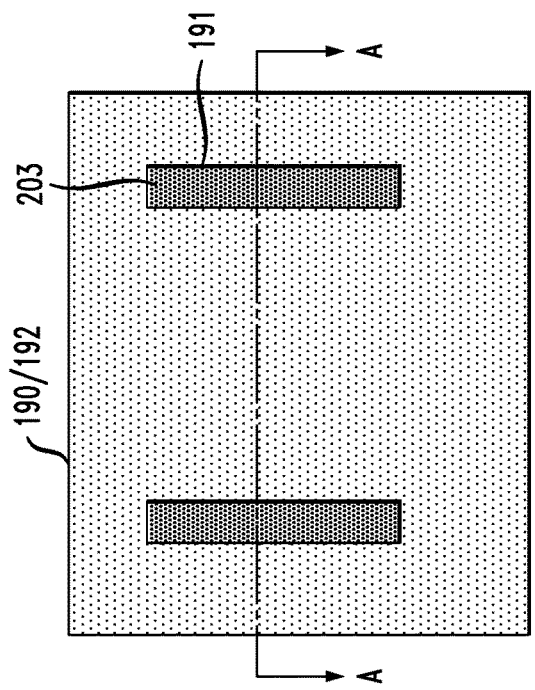
FIG. 15B is a top view illustrating oxidation of a silicon germanium (SiGe) layer on the substrate in a method for manufacturing a semiconductor device, according to an exemplary embodiment of the present invention.
Figure 15A:
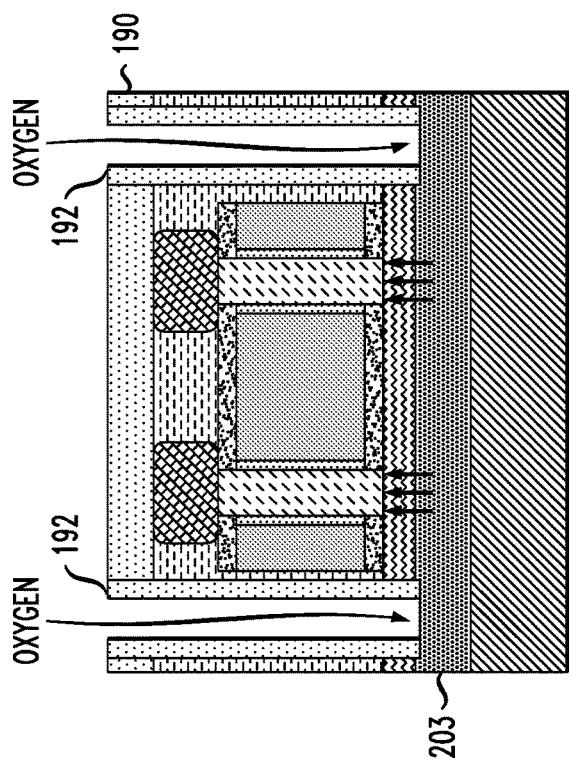
FIG. 15A is a cross-sectional view illustrating oxidation of a silicon germanium (SiGe) layer on the substrate in a method for manufacturing a semiconductor device, according to an exemplary embodiment of the present invention.

FIGS. 15A and 15B are respective cross-sectional and top views illustrating oxidation of a silicon germanium (SiGe) layer on the substrate in a method for manufacturing a semiconductor device, according to an exemplary embodiment of the present invention. More specifically, FIG. 15A is a cross-sectional view taken along line A-A in FIG. 15B. As shown in FIGS. 15A and 15B, in accordance with an embodiment of the present invention, oxygen is introduced via trenches 191 to oxidize the layer 103 including SiGe.

According to an embodiment of the present invention, during an oxidation process, the SiGe layer 103 is consumed and forms silicon dioxide ($SiO_2$). Germanium in the SiGe layer 103 may diffuse upwards to the fin and downwards to the substrate. In another embodiment, both silicon and germanium in the SiGe layer 103 react with oxidation species to form silicon germanium oxide. As can be seen in FIGS. 15A and 15B, as a result of oxidation of all or substantially all of the SiGe layer, a resultant oxide layer 203 is formed.

The oxidation process is performed at a temperature sufficient enough to cause oxidation of the epitaxial SiGe. In an embodiment of the present invention, the oxidation is performed at a temperature from about 500° C. to about 800° C. For example, oxidation can be performed at a temperature of about 630° C., where the oxidation rate of SiGe with respect to Si is $R_{SiGe}:R_{Si} \sim 30:1$ for 50% SiGe.

In accordance with an embodiment of the present invention, the oxidation is performed in an oxidizing ambient which includes at least one oxygen-containing gas such as, for example, $O_2$, NO, $N_2O$, ozone, water steam, air and other like oxygen-containing gases. The oxygen-containing gases may be admixed with each other (such as an admixture of $O_2$ and NO), or the gas may be diluted with an inert gas such as, for example, He, Ar, $H_2N_2$, Xe, Kr, or Ne. In an embodiment, the oxidation process is performed in a so-called wet oxidation environment with water (reaction of hydrogen with oxygen). During the wet oxidation process, water steam diffuses into the SiGe 103 and converts it into oxide.

In accordance with an embodiment of the present invention, the oxidation may be carried out for a variable period of time. In one example, the oxidation process is carried out for a time period from about 5 seconds to about 5 hours, depending on oxidation temperature and oxidation species. In another embodiment, the oxidation process may be carried out for a time period from about 5 minutes to about 30 minutes. The oxidation process may be carried out at a single targeted temperature, or various ramp and soak cycles using various ramp rates and soak times can be employed.

As can be seen by the upward facing arrows in FIG. 15A, due to oxidation-induced volume expansion of layer 203, the fins 120 are pushed up, while the upper dielectric layer 190 serves as an anchor. As a result, vertical strain is produced in the fins 120.

Figure 16:
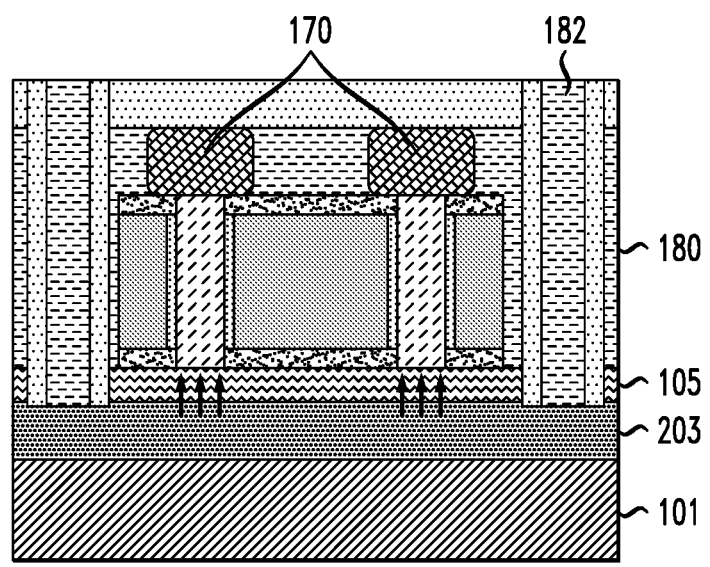
FIG. 16 is a cross-sectional view illustrating deposition and planarization of additional interlayer dielectric layers in a method for manufacturing a semiconductor device, according to an exemplary embodiment of the present invention.

FIG. 16 is a cross-sectional view illustrating deposition and planarization of additional interlayer dielectric layers in a method for manufacturing a semiconductor device, according to an exemplary embodiment of the present invention. As shown in FIG. 16, a dielectric material, including, but not limited to $SiO_2$, LTO, HTO, FOX or some other dielectric, is deposited on the structure from FIGS. 15A and 15B in the trenches 191 on the layer 203 and on the sidewall spacers 192 to form interlayer dielectric layers 182. The interlayer dielectric layers 182 can be deposited using deposition techniques including, but not limited to, CVD, PECVD, RFCVD, PVD, ALD, MLD, MBD, PLD, and/or LSMCD, sputtering, and/or plating. Planarization, for example, CMP can be performed to remove excess material from layers 182 and planarize the resulting structure.

In another embodiment, in order to impart the stress into the vertical channels, oxidation of the SiGe layer 103 can also be performed after the trenches 191 have been filled with oxygen permeable material.

Figure 17B:
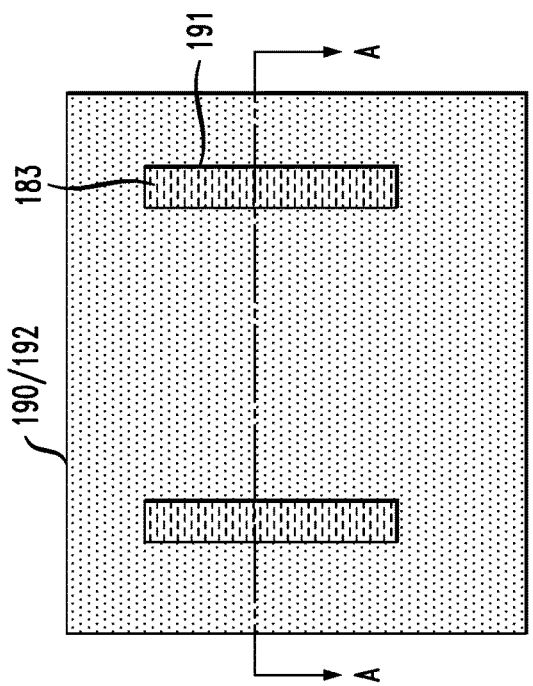
FIG. 17B is a top view illustrating deposition and planarization of additional interlayer dielectric layers in a method for manufacturing a semiconductor device, according to an exemplary embodiment of the present invention.
Figure 17A:
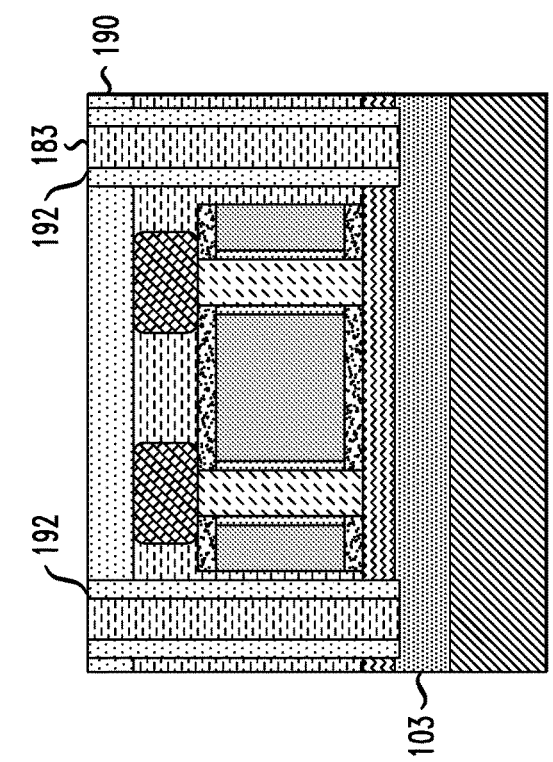
FIG. 17A is a cross-sectional view illustrating deposition and planarization of additional interlayer dielectric layers in a method for manufacturing a semiconductor device, according to an exemplary embodiment of the present invention.

FIG. 17A is a cross-sectional view illustrating deposition and planarization of additional interlayer dielectric layers in a method for manufacturing a semiconductor device, according to an exemplary embodiment of the present invention. As shown in FIG. 17A, a dielectric material, including, but not limited to $SiO_2$, LTO, HTO, FOX or some other dielectric, is deposited on the structure from FIGS. 17A and 17B in the trenches 191 on the layer 103 and on the sidewall spacers 192 to form interlayer dielectric layers 183. The interlayer dielectric layers 183 can be deposited using deposition techniques including, but not limited to, CVD, PECVD, RFCVD, PVD, ALD, MLD, MBD, PLD, and/or LSMCD, sputtering, and/or plating. Planarization, for example, CMP can be performed to remove excess material from layers 183 and planarize the resulting structure. The dielectric layers 183 contain a material that is permeable to an oxidation species. For example, the dielectric layers 183 contain silicon oxide that allows oxygen or water vapor diffuse through it so that the silicon germanium layer 103 can be oxidized in a subsequent process.

More specifically, FIG. 17A is a cross-sectional view taken along line A-A in FIG. 17B. As shown in FIGS. 17A and 17B, in accordance with an embodiment of the present invention, trenches 191 are filled with an oxygen permeable material 183.

Figure 18B:
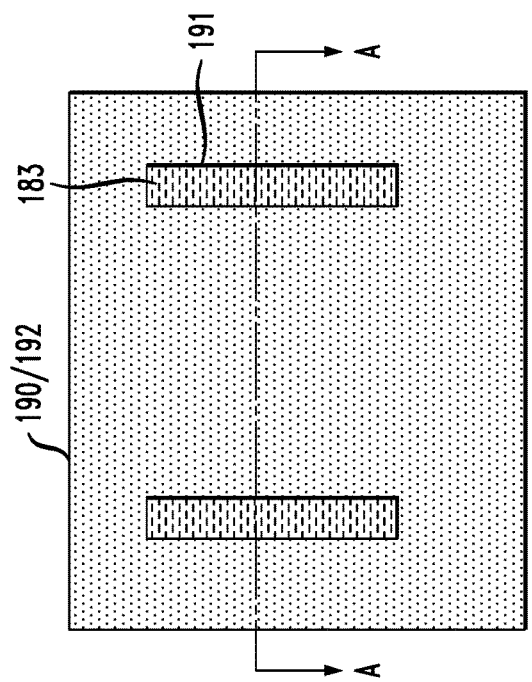
FIG. 18B is a top view illustrating oxidation of a silicon germanium (SiGe) layer on the substrate in a method for manufacturing a semiconductor device, according to an exemplary embodiment of the present invention.
Figure 18A:
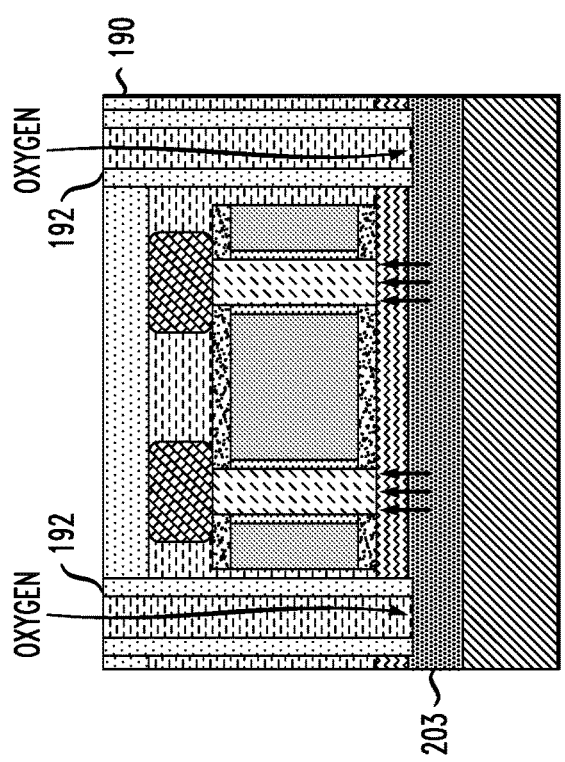
FIG. 18A is a cross-sectional view illustrating oxidation of a silicon germanium (SiGe) layer on the substrate in a method for manufacturing a semiconductor device, according to an exemplary embodiment of the present invention.

Referring to FIG. 18A, according to an embodiment of the present invention, during an oxidation process, the SiGe layer 103 is converted into oxide. More specifically, FIG. 18A is a cross-sectional view taken along line A-A in FIG. 18B. In one embodiment, the silicon from the SiGe layer 103 is consumed and forms silicon dioxide ($SiO_2$). Germanium in the SiGe layer 103 may diffuse upwards to the fin and downwards to the substrate. In another embodiment, both silicon and germanium in the SiGe layer 103 react with oxidation species to form silicon germanium oxide. As can be seen in FIG. 18A, as a result of oxidation of all or substantially all of the SiGe layer, a resultant oxide layer 203 is formed.

The oxidation process is performed at a temperature sufficient enough to cause oxidation of the epitaxial SiGe. In an embodiment of the present invention, the oxidation is performed at a temperature from about 500° C. to about 800° C. For example, oxidation can be performed at a temperature of about 630° C., where the oxidation rate of SiGe with respect to Si is $R_{SiGe}:R_{Si} \sim 30:1$ for 50% SiGe.

In accordance with an embodiment of the present invention, the oxidation is performed in an oxidizing ambient which includes at least one oxygen-containing gas such as, for example, $O_2$, NO, $N_2O$, ozone, air, water steam, and other like oxygen-containing gases. The oxygen-containing gases may be admixed with each other (such as an admixture of $O_2$ and NO), or the gas may be diluted with an inert gas such as, for example, He, $H_2$, Ar, $N_2$, Xe, Kr, or Ne. In a preferred embodiment, the oxidation process is performed in a so-called wet oxidation in the environment with water (reaction of hydrogen with oxygen). During wet oxidation process, water steam diffuses through the oxidation permeable dielectric 183 to convert the SiGe 103 into oxide.

In accordance with an embodiment of the present invention, the oxidation may be carried out for a variable period of time. In one example, the oxidation process is carried out for a time period from about 5 seconds to about 5 hours, depending on oxidation temperature and oxidation species. In another embodiment, the oxidation process may be carried out for a time period from about 5 minutes to about 30 minutes. The oxidation process may be carried out at a single targeted temperature, or various ramp and soak cycles using various ramp rates and soak times can be employed.

Figure 19:
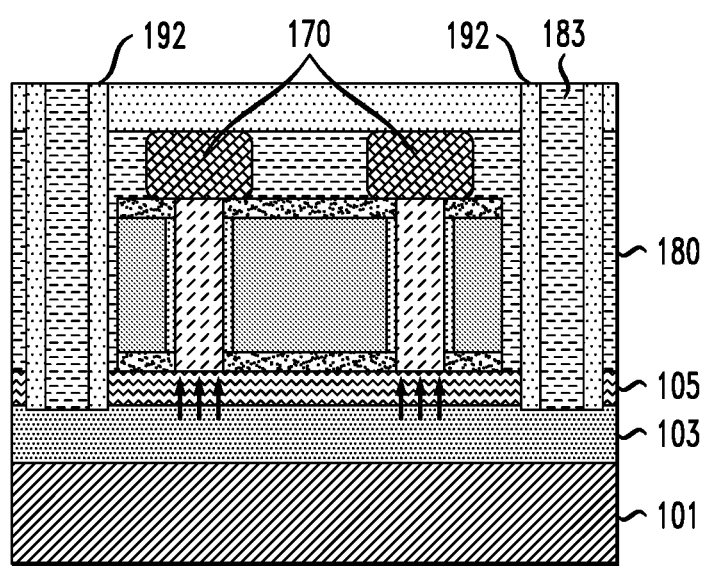
FIG. 19 is a cross-sectional view illustrating oxidation of a silicon germanium (SiGe) layer on the substrate in a method for manufacturing a semiconductor device, according to an exemplary embodiment of the present invention.

As can be seen by the upward facing arrows in FIG. 19, due to oxidation-induced volume expansion of layer 203, the fins 120 are pushed up, while the upper dielectric layer 190 in conjunction with the dielectric 183 and spacers 192 serves as an anchor. As a result, vertical strain is produced in the fins 120. Further processing in connection with known methods can be performed to form electrically conductive contact regions, such as, for example, middle of the line (MOL) contact regions to provide electrical current to the bottom source/drain region 105. Conductive metal used for the contact regions can include, but is not limited to, tungsten, cobalt, ruthenium, copper, or combinations thereof, and may be deposited using, for example, deposition techniques including, but not limited to, CVD, PECVD, RFCVD, PVD, ALD, MLD, MBD, pulsed laser deposition, and/or LSMCD, sputtering, and/or plating.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a first semiconductor layer on a substrate;
   forming a bottom source/drain region on the first semiconductor layer;
   forming a second semiconductor layer on the bottom source/drain region;
   patterning the second semiconductor layer into a plurality of fins extending from the bottom source/drain region vertically with respect to the substrate;
   forming a gate structure around the plurality of fins;
   forming a top source/drain region on each of the plurality of fins;
   oxidizing the first semiconductor layer to form an oxide layer in place of the first semiconductor layer, wherein a volume of the oxide layer is larger than a volume of the first semiconductor layer prior to the oxidation; and
   producing a strain in each of the plurality of fins due to the larger volume of the oxide layer.

2. The method according to claim 1, wherein the first semiconductor layer comprises silicon germanium.

3. The method according to claim 1, further comprising forming an interlayer dielectric layer on the bottom source/drain region and on the gate structure.

4. The method according to claim 3, further comprising forming an upper dielectric layer on the interlayer dielectric layer and on the top source/drain regions.

5. The method according to claim 4, further comprising:
   removing a portion of the upper dielectric layer, the interlayer dielectric layer and the bottom source/drain region to form at least one trench exposing the first semiconductor layer;
   wherein an oxidizing ambient used for oxidizing the first semiconductor layer is introduced through the at least trench.

6. The method according to claim 5, further comprising lining sides of the at least trench with a sidewall spacer.

7. The method according to claim 6, wherein the sidewall spacer comprises the same material as the upper dielectric layer.

8. The method according to claim 7, wherein the upper dielectric layer and the sidewall spacer each comprise a nitride.

9. The method according to claim 5, wherein the at least one trench is positioned along a side of the gate structure.

10. The method according to claim 4, wherein the upper dielectric layer comprises a nitride.

11. The method according to claim 5, further comprising filling the at least one trench with a dielectric material after oxidizing the first semiconductor layer.

12. The method according to claim 5, further comprising filling the at least one trench with an oxygen permeable dielectric material before oxidizing the first semiconductor layer.

13. A semiconductor device, comprising:
   a substrate;
   an oxide layer on the substrate;
   a bottom source/drain region on the oxide layer;
   a plurality of fins extending from the bottom source/drain region vertically with respect to the substrate;
   a gate structure around the plurality of fins; and
   a top source/drain region on each of the plurality of fins;
   wherein each of the plurality of fins is strained in vertical direction with respect to the substrate.

14. The semiconductor device according to claim 13, further comprising:
   an interlayer dielectric layer on the bottom source/drain region and on the gate structure; and
   an upper dielectric layer on the interlayer dielectric layer and on the top source/drain regions.

15. The semiconductor device according to claim 14, further comprising:
   at least one trench formed through the upper dielectric layer, the interlayer dielectric layer and the bottom source/drain region to the oxide layer.

16. The semiconductor device according to claim 15, further comprising a sidewall spacer lining sides of the at least trench.

17. The semiconductor device according to claim 16, wherein the sidewall spacer comprises the same material as the upper dielectric layer.

18. The semiconductor device according to claim 16, wherein a remaining portion of the at least one trench comprises a dielectric material.

19. A method for manufacturing a semiconductor device, comprising:
   epitaxially growing a first semiconductor layer comprising silicon germanium on a substrate;
   epitaxially growing a bottom source/drain region on the first semiconductor layer;
   epitaxially growing a second semiconductor layer on the bottom source/drain region;
   patterning the second semiconductor layer into a plurality of fins extending from the bottom source/drain region vertically with respect to the substrate;
   forming a gate structure around the plurality of fins;
   forming a top source/drain region on each of the plurality of fins;
   oxidizing the first semiconductor layer to form an oxide layer in place of the first semiconductor layer, wherein a volume of the oxide layer is larger than a volume of the first semiconductor layer prior to the oxidation; and
   producing a strain in each of the plurality of fins due to the larger volume of the oxide layer.

20. The method according to claim 19, further comprising:
   forming an interlayer dielectric layer on the bottom source/drain region and on the gate structure; and
   forming an upper dielectric layer on the interlayer dielectric layer and on the top source/drain regions.

* * * * *